(12) United States Patent
Ichikawa et al.

(10) Patent No.: US 6,285,235 B1
(45) Date of Patent: Sep. 4, 2001

(54) GATE CONTROL CIRCUIT FOR VOLTAGE DRIVE SWITCHING ELEMENT

(75) Inventors: Kosaku Ichikawa, Tokyo; Tateo Koyama, Saitama-ken; Hitoshi Matsumura, Kanagawa-ken; Shinji Sato, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/266,774

(22) Filed: Mar. 12, 1999

(30) Foreign Application Priority Data

Mar. 31, 1998 (JP) ............................................ PH10-085435

(51) Int. Cl.$^7$ ................................................. H03K 17/04
(52) U.S. Cl. .............................. 327/374; 327/434; 326/17
(58) Field of Search ..................................... 327/365, 374, 327/376, 377, 379, 380, 381, 392, 393, 394, 398, 427, 432, 433, 434; 326/17, 18, 20

(56) References Cited

U.S. PATENT DOCUMENTS

| | | | |
|---|---|---|---|
| 4,885,486 | * 12/1989 | Shekhawat et al. | 327/377 |
| 5,055,721 | * 10/1991 | Majumdar et al. | 327/434 |
| 5,500,619 | * 3/1996 | Miyasaka | 327/427 |
| 5,808,504 | * 9/1998 | Chikai et al. | 327/434 |
| 5,986,484 | * 11/1999 | Kimata | 327/108 |

FOREIGN PATENT DOCUMENTS

| | | |
|---|---|---|
| 7-67317 | 3/1995 | (JP) . |
| 7-264028 | 10/1995 | (JP) . |

* cited by examiner

*Primary Examiner*—Kenneth B. Wells
*Assistant Examiner*—Hai L. Nguyen
(74) *Attorney, Agent, or Firm*—Oblon, Spivak, McClelland, Maier & Neustadt, P.C.

(57) ABSTRACT

A gate control circuit for turning on and off an insulated gate semiconductor device having gate, emitter and collector terminals, including a first DC power source coupled to the gate terminal via a first switch and configured to apply a positive voltage to the gate terminal in order to turn on the insulated gate semiconductor device when the first switch is turned on and the second switch is turned off; a second DC power source coupled to the gate terminal via a second switch and configured to apply a negative voltage to the gate terminal in order to turn off the insulated gate semiconductor device when the second switch is turned on and the first switch is turned off; a parallel circuit of a diode and a capacitor coupled in series to the second switch; and a turn off assist circuit configured to produce a negative charge on the capacitor to assist in turning off the insulated gate semiconductor device. In a power converter circuit having a plurality of insulated gate semiconductor devices, equalization of delay times for turning off the insulated gate semiconductor devices is achieved by controlling a charged stored in the capacitor of each gate control circuit based on detected collector-emitter voltages or detected emitter currents.

13 Claims, 13 Drawing Sheets

GATE CONTROL CIRCUIT FOR VOLTAGE DRIVE SWITCHING ELEMENT

CROSS REFERENCE TO RELATED APPLICATIONS

This application claims benefit of priority to Japanese Patent Application No. JP-1085435 filed Mar. 31, 1998, the entire contents of which is incorporated by reference herein.

BACKGROUND OF THE INVENTION

1. Field of the Invention

The present invention relates to a gate control circuit for turning on and off a voltage drive switching element such as an insulated gate semiconductor device of a MOS gate structure, for example, a MOS-FET, an IGBT (Insulated Gate Bipolar Transistor) and an IEGT (Injection Enhanced Gate Transistor).

2. Description of the Background

The insulated gate semiconductor device is used as a switching element of a power converter, for example an inverter which drives an induction motor, a frequency modulator and an uninterruptable power supply for supplying power to peripherals in case of a power failure.

Above all, the IGBT has been widely used in industrial equipment due to its voltage actuation characteristic and its capability of switching a relatively high current.

FIG. 1 shows a conventional gate control circuit for IGBT 1. In FIG. 1, IGBT 1 is an insulated gate semiconductor device having a collector terminal C, an emitter terminal E and a gate terminal G. A gate control circuit 100, shown by the chained line, is connected between the terminals G and E.

The gate control circuit 100 is composed of a first DC (Direct Current) power source 2A, a second DC power source 2B, a first switch 3A for applying a positive voltage to IGBT 1, a second switch 3B for applying a negative voltage to IGBT 1, and a gate resistor 4. A series circuit of the gate resistor 4, the first switch 3A and the first DC power source 2A is connected between the terminals G and E of IGBT 1. Further, a series circuit of the second DC power source 2B and the second switch 3B is connected between the junction of the terminal E and a negative terminal of the first DC power source 2A and the junction of the first switch 3A and the gate resistor 4. Furthermore, the terminal C and the terminal E are connected to a main circuit of a power converter (not shown).

IGBT 1 is turned on by applying a positive voltage across the terminals G and E, and is turned off by applying a negative voltage across the terminals G and E.

FIG. 2 is a timing chart showing a relationship between the voltage Vce and current Ic between a collector terminal C and an emitter terminal E of IGBT 1, and the voltage Vge and current Ig between a gate terminal G and an emitter terminal E of IGBT 1 at the time IGBT 1 turns off.

Upon turn off, the second switch 3B switches on in order to apply the negative voltage which is a driving voltage Vg. Then, the voltage Vge, called a mirror voltage, between the terminals G and E is maintained during turn off transition. The gate current Ig is almost constant during the transition. When the integration of the gate current Ig (electrical charge) reaches a certain amount of electrical charge, a current Ic flowing in IGBT 1 decreases and finally IGBT 1 turns off.

However, as shown in FIG. 2, there is a time delay to turn off IGBT 1 completely after switching on the second switch 3B because the mirror voltage has a positive value for a while (a mirror time). The mirror voltage, between the terminals G and E, caused by a mirror effect being proper to IGBT 1 remains until electrical charge stored in stray capacitance between the terminals G and E is completely discharged. This delay time has an adverse influence on efficiency.

One method to reduce the delay time is to lower the resistance of the gate resistor 4 and increase the gate current Ig. But this approach gives rise to a surge voltage between the terminals G and E, because the gate current Ig rises suddenly. Therefore, lowering the resistance of the gate resistor 4 results in increasing a switching loss of the IGBT 1. As a result, the resistance of the gate resistor 4 can not be changed easily.

Moreover, if a power converter is composed of a plurality of insulated gate semiconductor devices such as IGBT 1 respectively connected in serial or in parallel and the turn off delay times are different from each other, the power converter loses balance in the voltage or current applied to the insulated gate semiconductor devices. As a result, a high voltage or current is concentrated on one of the insulated gate semiconductor devices.

SUMMARY OF THE INVENTION

Accordingly, one object of this invention is to provide a gate control circuit which can reduce a delay time to turn off an insulated gate semiconductor device after switching off a switch without lowering the resistance of the gate resistor.

Another object of this invention is to provide a gate control circuit which can stop an outbreak of a surge voltage applied to an insulated gate semiconductor device.

Another object of this invention is to provide a power converter circuit which can simultaneously turn on or turn off a plurality of insulated gate semiconductor devices.

These and other objects are achieved by providing a new and improved gate control circuit for turning on and off an insulated gate semiconductor device having gate, emitter and collector terminals; including a first DC power source coupled to the gate terminal via a first switch and configured to apply a positive voltage to the gate terminal in order to turn on the insulated gate semiconductor device when the first switch is turned on and the second switch is turned off; a second DC power source coupled to the gate terminal via a second switch and configured to apply a negative voltage to the gate terminal in order to turn off the insulated gate semiconductor device when the second switch is turned on and the first switch is turned off; a parallel circuit of a diode and a capacitor coupled in series to the second switch; and a turn off assist circuit configured to produce a negative charge on the capacitor to assist in turning off the insulated gate semiconductor device.

According to one aspect of this invention, there is provided a power converter circuit having a plurality of insulated gate semiconductor devices, each provided with a respective gate control circuit, wherein equalization of delay times for turning off the insulated gate semiconductor devices is achieved by controlling a charge stored in the capacitor of each gate control circuit based on detected collector-emitter voltages or detected emitter currents.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
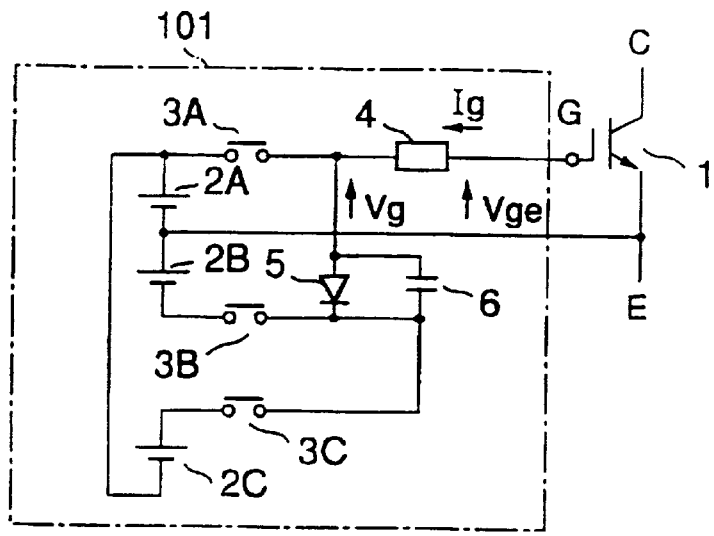
FIG. 3 is a circuit diagram of a gate control circuit of a first embodiment of the present invention.

Referring now to the drawings, wherein like reference numerals designate identical or corresponding parts throughout the several views, FIG. 3 shows a gate control circuit 101 of a first embodiment of the present invention. In FIG. 3, IGBT 1 is an insulated gate semiconductor device having a collector terminal C, an emitter terminal E and a gate terminal G. The gate control circuit 101 indicated by the chain line is connected between the terminals G and E.

The gate control circuit 101 has a first DC (Direct Current) power source 2A, a second DC power source 2B, a first switch 3A for applying a positive voltage to IGBT 1, a second switch 3B for applying a negative voltage to IGBT 1, and a gate resistor 4. A series circuit of the gate resistor 4, the first switch 3A and the first DC power source 2A is connected between the terminals G and E of IGBT 1. Further, a series circuit of the second DC power source 2B and the second switch 3B is connected between the junction of the terminal E and a negative terminal of the first DC power source 2A and the junction of the first switch 3A and the gate resistor 4. Furthermore, the terminal C and the terminal E are connected to a main circuit of a power converter (not shown). The above composition is the same as FIG. 1.

Figure 1:
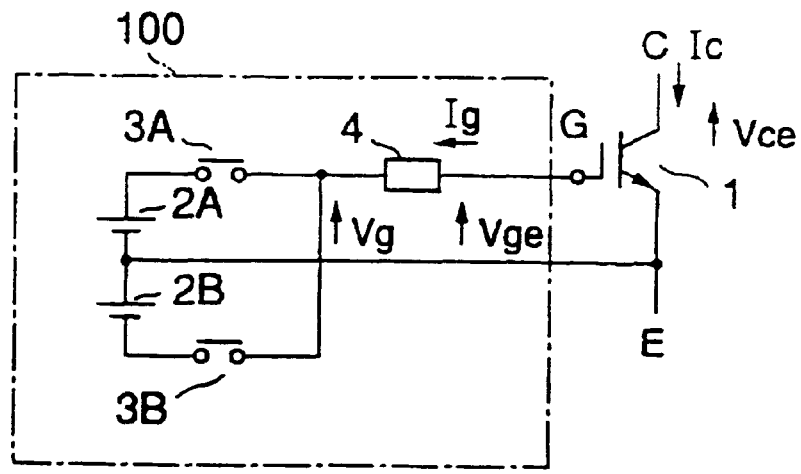
FIG. 1 is a circuit diagram of a conventional gate control circuit of an IGBT.
Figure 2:
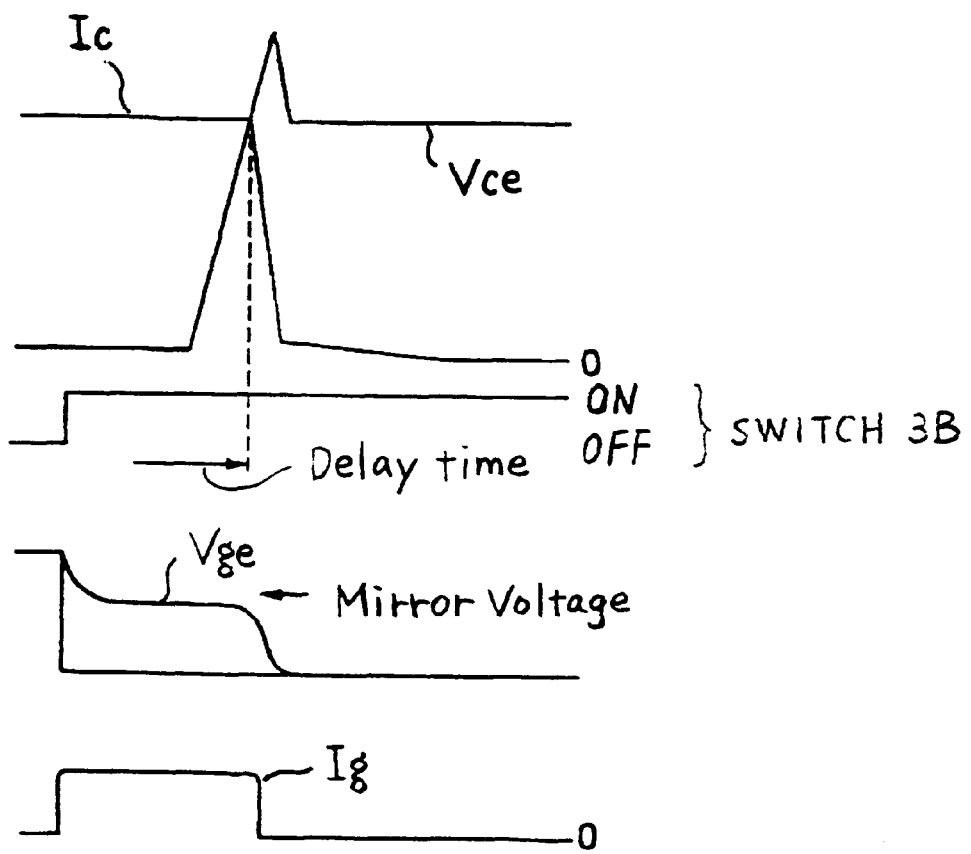
FIG. 2 is a timing chart showing a relationship between the voltage and current between a collector terminal and an emitter terminal of the IGBT, and the voltage and current between a gate terminal and an emitter terminal of the IGBT.

The difference between FIG. 1 and FIG. 3 is that the gate control circuit 101 further includes a diode 5, a capacitor 6, a third switch 3C and a third DC power source 2C, as next described.

Figure 4:
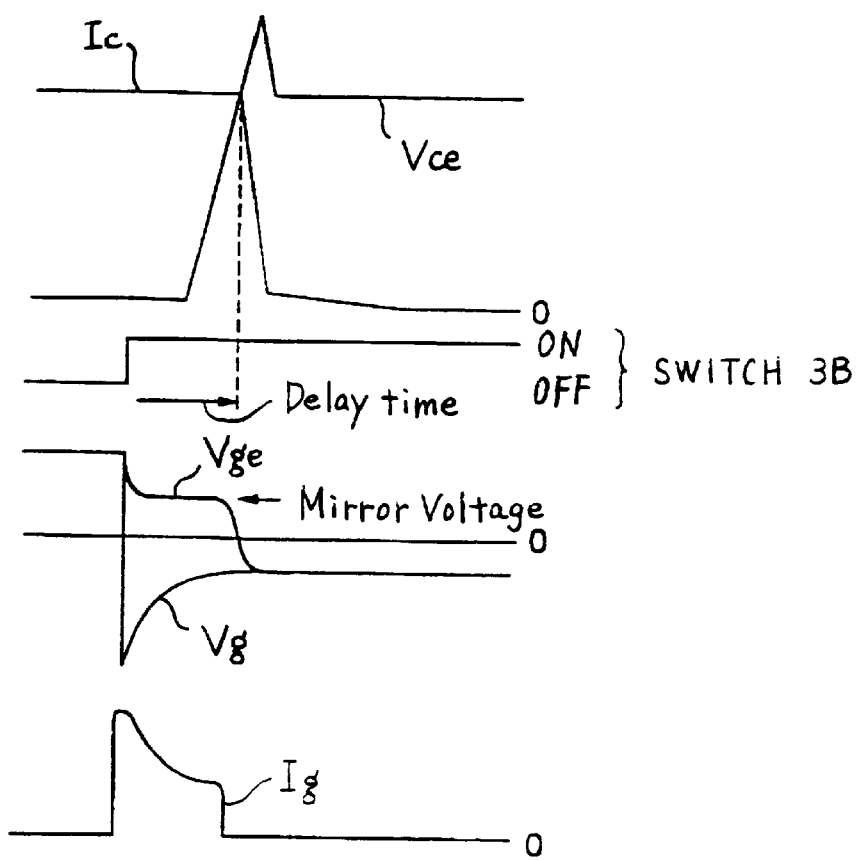
FIG.4 is a timing chart showing a relationship between the voltage and current between a collector terminal and an emitter terminal of the IGBT, and the voltage and current between a gate terminal and an emitter terminal of the IGBT in FIG. 3

First, a parallel circuit of the diode 5 and the capacitor 6 is connected between the second switch 3B and the gate resistor 4. Second, a series circuit of the third switch 3C and the third DC power source 2C is connected between the junction of the first switch 3A and the first DC power source and the junction of the diode 5 and the capacitor 6. Upon actuation of the switch 3C, DC power source 2C charges the capacitor 6 by an amount less than an amount which can turn off the IGBT 1, The operation of the gate control circuit 101 of the first embodiment of the present invention is described in accordance with the timing chart of FIG. 4. In FIG. 4, current Ic is the current flowing between the collector terminal C and the emitter terminal E of the IGBT 1. Voltage Vce is the voltage between the collector terminal C and the emitter terminal E of the IGBT 1. Gate voltage Vge is the voltage between the gate terminal G and the emitter terminal E, and driving voltage Vg is the voltage for turning on and off the IGBT 1. Gate current Ig is the current for turning on and off the IGBT 1. A delay time is the time to turn off IGBT I completely after switching on the second switch 3B.

IGBT 1 is turned on by applying a positive voltage across the terminals G and E, and is turned off by applying a negative voltage across the terminals G and E.

The first switch 3A and the third switch 3C switch on and off simultaneously, such that when both the first switch 3A and the third switch 3C switch on, the capacitor 6 is charged by the voltage of the third DC power source 2C. At the time to turn off IGBT 1, that is to say, when both the first switch 3A and the third switch 3C switch off, and the second switch 3B switches on, the sum of the voltage of the capacitor 6 and the voltage of the second DC power source 2B is applied to the IGBT 1 as the driving voltage Vg. Then, when the charge of the capacitor 6 discharges up to zero voltage, the driving voltage Vg reaches the voltage of the second DC power source 2B via the diode 5.

As shown in FIG. 4, since a relatively large gate current Ig flows during the transition period, the delay time can be reduced. As the capacitor 6 almost finishes to discharge at the time the current Ic starts to decrease, no more than the voltage of the second DC voltage 2B is applied to the IGBT 1 while the IGBT 1 turns off.

Figure 5:
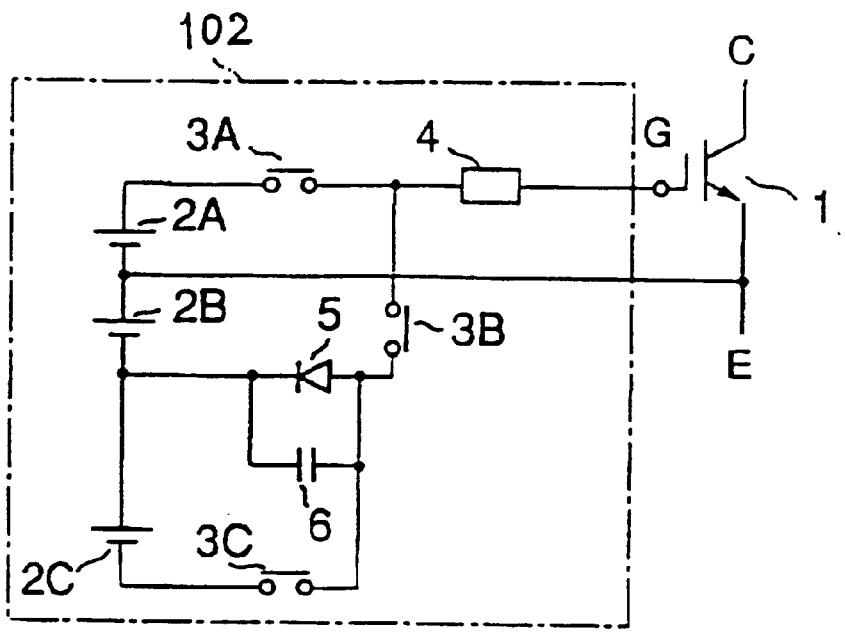
FIG. 5 is a circuit diagram of a gate control circuit of a second embodiment of the present invention.

FIG. 5 shows a gate control circuit 102 of a second embodiment of the present invention.

In the second embodiment, the junctions of the second DC power source 2B, the second switch 3B and the capacitor 6 are different from the first embodiment shown in FIG. 3.

As shown in FIG. 5, the positions of the switch 3B and the capacitor 6 are reversed, and the positive terminal of the third DC power source 2C is connected to the negative terminal of the second DC power source 2B.

The second embodiment has the same operation and effect as the first embodiment, and also switches 3A, 3B and 3C switch in the same way as in the first embodiment.

Figure 6:
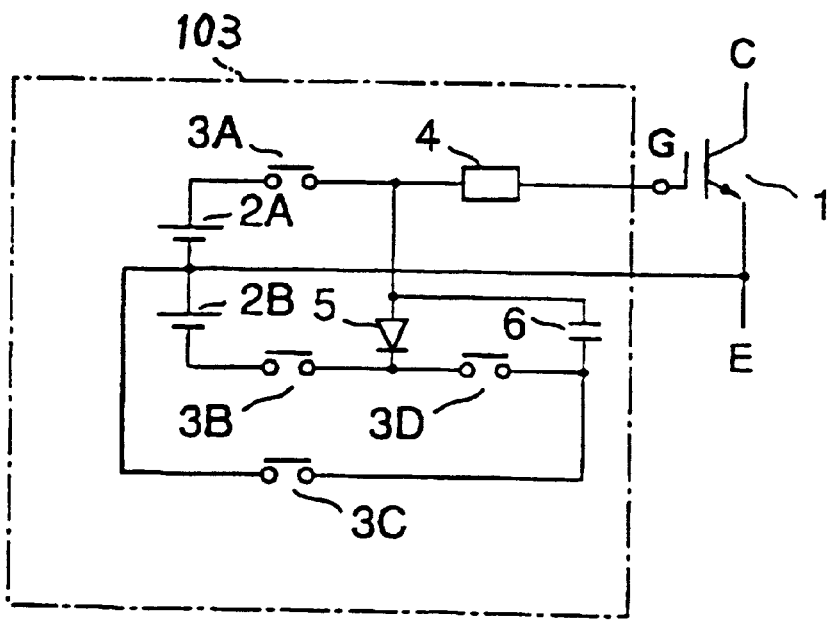
FIG. 6 is a circuit diagram of a gate control circuit of a third embodiment of the present invention.

FIG. 6 shows a gate control circuit 103 of a third embodiment of the present invention.

In the following description, only components different from the components explained in the first embodiment are described.

In the third embodiment, the third DC power source 2C in FIG. 3 is removed and the second DC power source 2B is configured to substitute for the third DC power source 2C. Further, a fourth switch 3D is added. More particularly, the fourth switch 3D is connected to between the negative terminal of the diode 5 and the capacitor 6. One terminal of the third switch 3C is connected to the junction of the capacitor 6 and the fourth switch 3D. The other terminal of the third switch 3C is connected to the junction of the first DC power source 2A and the second DC power source 2B.

In the third embodiment, the switches 3A and 3B operate in the same way as the gate control circuit 100 in FIG. 1. Whenever the second switch 3B switches on, the third switch 3C switches on and the fourth switch 3D switches off. Consequently, the capacitor 6 is charged by the voltage of the second DC power source 2B. The other operations of the third embodiment are the same as the first embodiment.

According to the third embodiment, since the third DC power source 2C is eliminated the number of DC power sources can be reduced.

Figure 7:
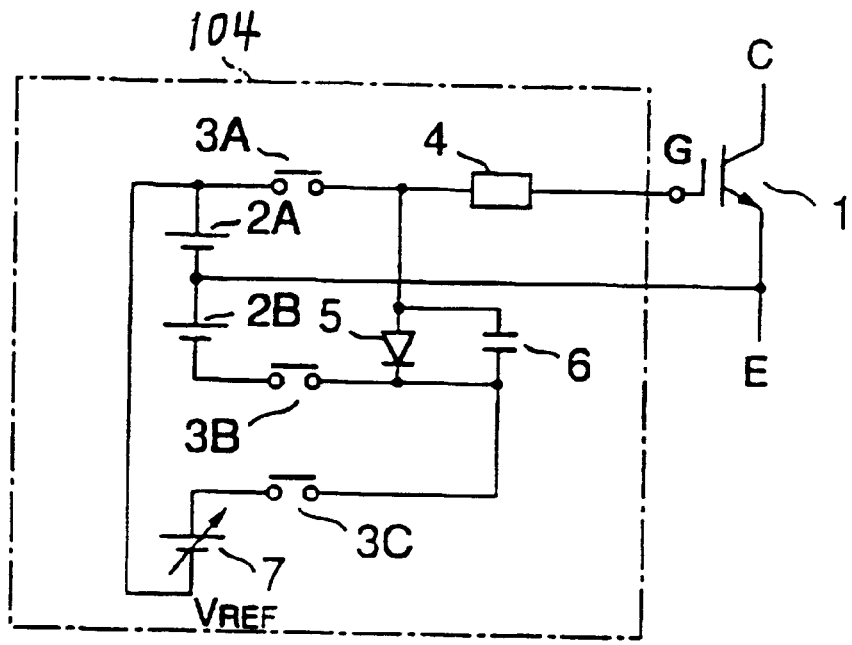
FIG. 7 is a circuit diagram of a gate control circuit of a fourth embodiment of the present invention.

FIG. 7 shows a gate control circuit 104 of a fourth embodiment of the present invention.

In the following description, only components different from the components explained in the first embodiment are described.

In the fourth embodiment, the third DC power source 2C in FIG. 3 is replaced with a variable DC power source 7. The switches 3A, 3B and 3C operate in the same way as the first embodiment shown in FIG. 3. According to the fourth embodiment, since the variable DC power source 7 is substituted for the third DC power source 2C, the amount of charge stored in the capacitor 6 can be adjusted at will. Further, the fourth embodiment has the same effect as the first embodiment.

Figure 8:
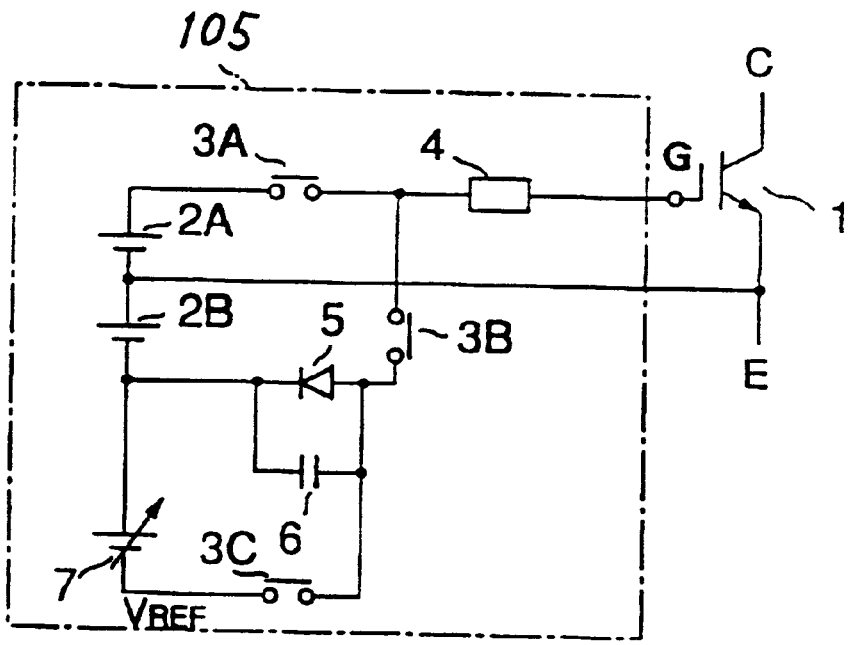
FIG. 8 is a circuit diagram of a gate control circuit of a fifth embodiment of the present invention.

FIG. 8 shows a gate control circuit 105 of a fifth embodiment of the present invention.

In the fifth embodiment, the junctions of the second DC power source 2B, the second switch 3B and the capacitor 6 are different from the fourth embodiment in FIG. 7.

As shown in FIG. 8, the positions of the switch 3B and the capacitor 6 are reversed, and the positive terminal of the variable DC power source 7 is connected to the negative terminal of the second DC power source 2B.

The fifth embodiment has the same operation and effect as the fourth embodiment, and also switches 3A, 3B and 3C switch in the same way as in the fourth embodiment.

Figure 9:
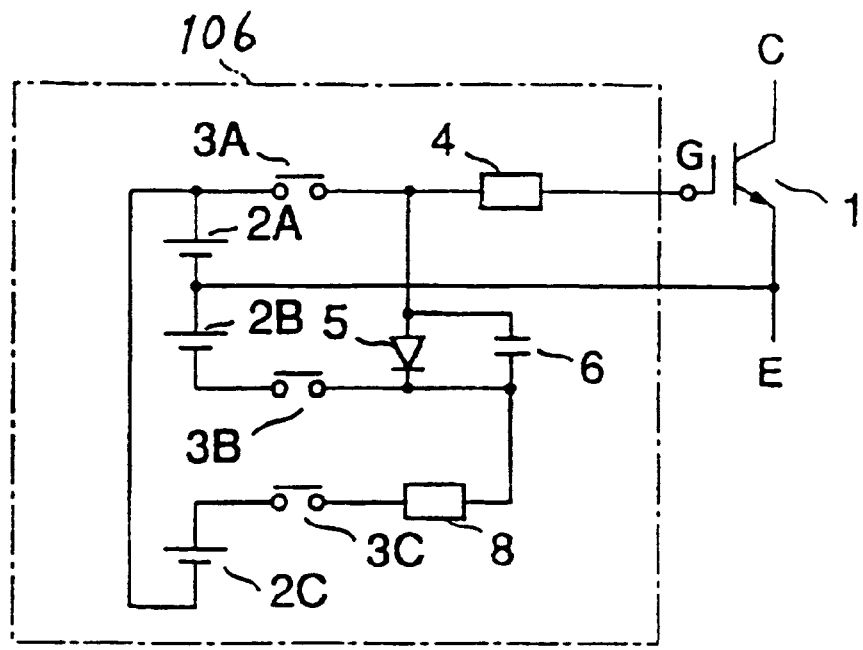
FIG. 9 is a circuit diagram of a gate control circuit of a sixth embodiment of the present invention.

FIG. 9 shows a gate control circuit 106 of a sixth embodiment of the present invention.

In the following description, only components different from the components explained in the first embodiment are described.

In the sixth embodiment, a resistor 8 is connected between the third switch 3C and the junction of the diode 5 and the capacitor 6 in order to adjust the charging speed for the capacitor 6. The operation of the sixth embodiment is as follows.

While the third switch 3C switches on with the first switch 3A on, the capacitor 6 is charged by the third DC power source 2C via the resistor 8. Accordingly, the amount of charge stored in the capacitor 6 can be controlled by adjusting the switch off timing of the third switch 3C. The other operations are the same as the first embodiment.

Figure 10:
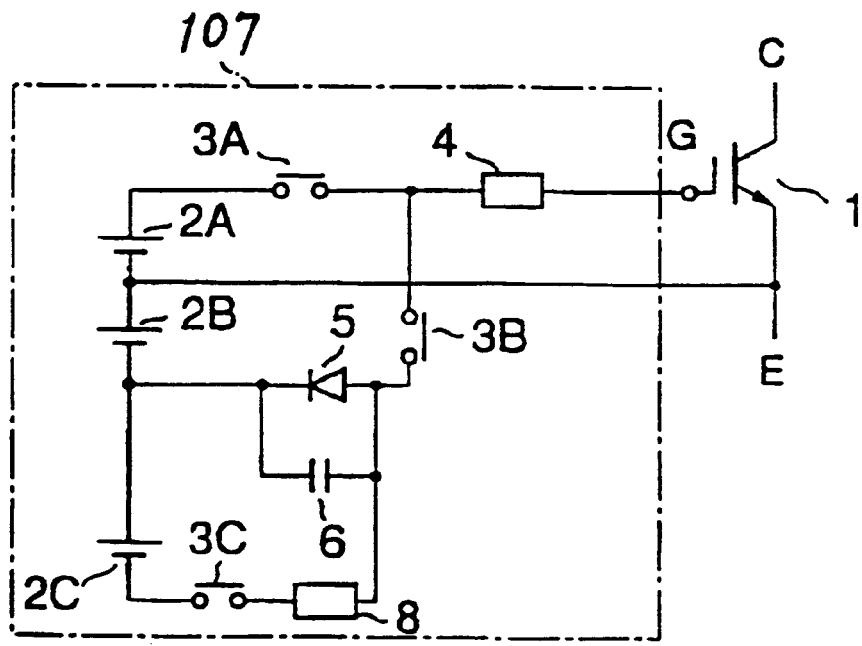
FIG. 10 is a circuit diagram of a gate control circuit of a seventh embodiment of the present invention.

FIG. 10 shows a gate control circuit 107 of a seventh embodiment of the present invention.

In the seventh embodiment, the junctions of the second DC power source 2B, the second switch 3B and the capacitor 6 are different from the sixth embodiment in FIG. 9.

As shown in FIG. 10, the positions of the switch 3B and the capacitor 6 are reversed, and the positive terminal of the third DC power source 2C is connected to the negative terminal of the second DC power source 2B.

The seventh embodiment has the same operation and effect as the sixth embodiment, and also switches 3A, 3B and 3C switch in the same way as in the sixth embodiment.

Figure 11:
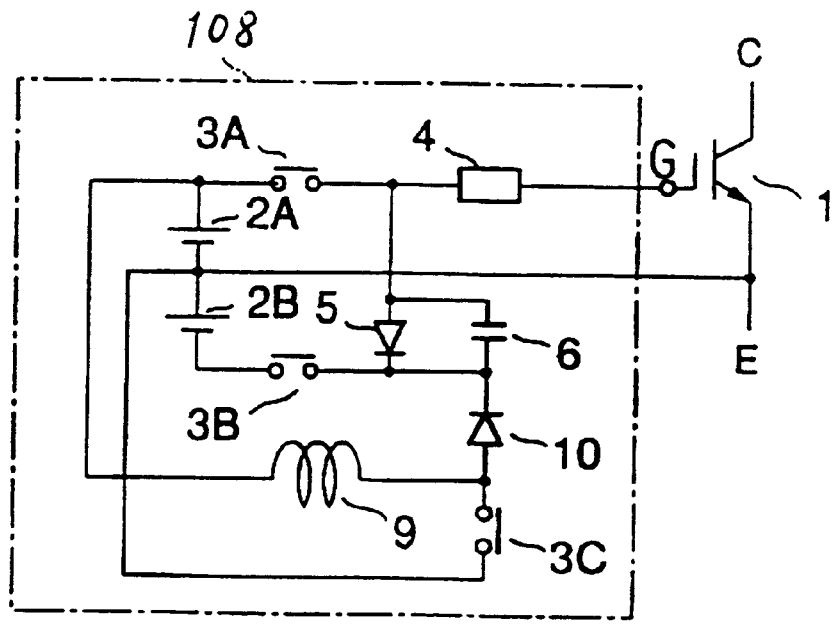
FIG. 11 is a circuit diagram of a gate control circuit of an eighth embodiment of the present invention.

FIG. 11 shows a gate control circuit 108 of an eighth embodiment of the present invention.

In the following description, only components different from the components explained in the first embodiment are described.

In the eighth embodiment of FIG. 11, the third DC power source 2C shown in FIG. 3 is removed and a reactor 9 and a diode 10 are added. As shown in FIG. 11, the diode 10 is connected between the third switch 3C and the junction of the capacitor 6 and the negative terminal of the diode 5. Further, one terminal of the reactor 9 is connected to the junction of the anode of the diode 10 and the third switch 3C, and the other terminal of the reactor 9 is connected to the positive terminal of the first DC power source 2A. Furthermore, one terminal of the third switch 3C is connected to the anode of the diode 10, and the other terminal of the third switch 3C is connected to the junction between the first DC power source 2A and the second DC power source 2B.

In the eighth embodiment, the reactor 9 is given energy by the first DC power source 2A. The energy given by the first DC power source 2A depends on the time duration that the third switch 3C is on. That is, a booster chopper is formed by the reactor 9 and the third switch 3C. Then, if the third switch 3C switches off, the energy stored in the reactor 9 is transferred to the capacitor 6 via the diode 10. Accordingly, the amount of charge stored in the capacitor 6 can be controlled by changing the time duration that the third switch 3C is on. Otherwise, the operation is the same as in the first embodiment.

Figure 12:
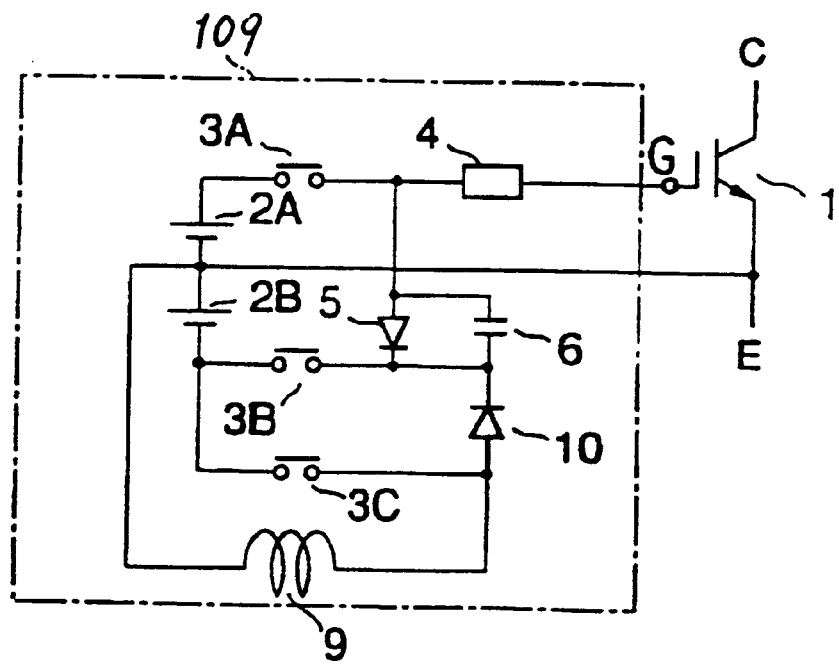
FIG. 12 is a circuit diagram of a gate control circuit of a ninth embodiment of the present invention.

FIG. 12 shows a gate control circuit 109 of a ninth embodiment of the present invention.

In the following description, only components different from the components explained in the first embodiment are described.

In the ninth embodiment, the third DC power source 2C in FIG. 3 is removed and a reactor 9 and a diode 10 are added as discussed in the following description.

As shown in FIG. 12, the anode of the diode 10 is connected between one terminal of the third switch 3C and the junction between the capacitor 6 and the cathode of the diode 5. Further, the other terminal of the third switch 3C is connected to the junction between the negative terminal of the second DC power source 2B and the second switch 3B. Further, one terminal of the reactor 9 is connected to the junction between the anode of the diode 10 and the third switch 3C, and the other terminal of the reactor 9 is connected to the junction between the first DC power source 2A and the second DC power source 2B.

In the ninth embodiment, while the third switch 3C switches on, the reactor 9 is given energy by the second DC power source 2B. The amount of the energy given by the second DC power source 2B depends on the time duration that the third switch 3C is on. Then, if the third switch 3C switches off, the energy of reactor 9 is transferred to the capacitor 6 via the diode 10. Consequently, the amount of charge stored in the capacitor 6 depends on the energy stored in the reactor 9. Accordingly, the amount of charge stored in the capacitor 6 can be controlled by changing the time duration that the third switch 3C is on. The other operations of the ninth embodiment are the same as in the first embodiment.

Figure 13:
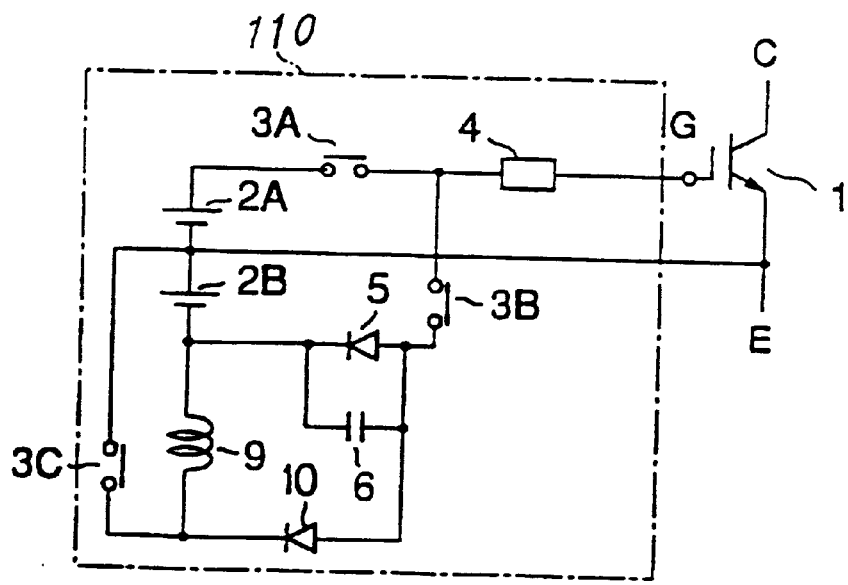
FIG. 13 is a circuit diagram of a gate control circuit of a tenth embodiment of the present invention.

FIG. 13 shows a gate control circuit 110 of a tenth embodiment of the present invention.

In the following description, only components different from the components explained in the ninth embodiment are described.

In the tenth embodiment, as shown in FIG. 10, the positions of the switch 3B and the capacitor 6 are reversed. Further, one terminal of the third switch 3C is connected to the junction between one terminal of the reactor 9 and the negative terminal of the diode 10, and the other terminal of the third switch 3C is connected to the junction between the first DC power source 2A and the second DC power source 2B. Furthermore, the other terminal of the reactor 9 is connected to the junction between the negative terminal of the second DC power source 2B and the capacitor 6.

The tenth embodiment has the same operation and effect as the ninth embodiment, and also switches 3A, 3B and 3C switch in the same way as in the ninth embodiment.

Figure 14:
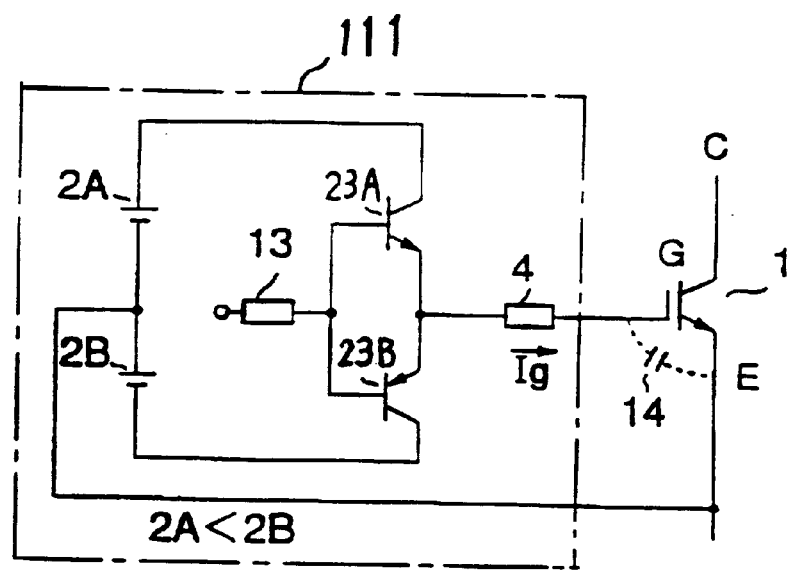
FIG. 14 is a circuit diagram of a gate control circuit of an eleventh embodiment of the present invention.

FIG. 14 shows a gate control circuit 111 of an eleventh embodiment of the present invention, in which a off gate current Ig for turning off the IGBT 1 can be larger than the gate current Ig for turning on the IGBT 1.

Figure 15:
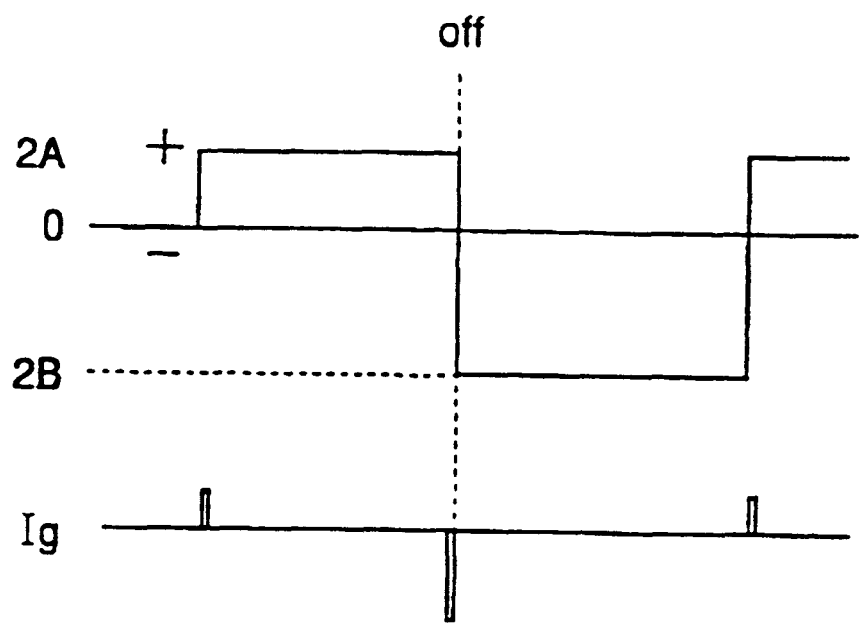
FIG. 15 is a timing chart showing a relationship between, the voltages of DC power sources 2A and 2B, and a gate current Ig flowing in the IGBT of FIG. 14.

In FIG. 14, the absolute voltage of the second DC power source 2B, for example 30 volts, is higher than the absolute voltage of the first DC power source 2A, for example 15 volts, as shown in FIG. 15. One terminal of the gate resistor 4 is connected to the gate terminal G of the IGBT 1, and the other terminal of the gate resistor 4 is connected to the junction of switches such as a npn-transistor 23A and a pnp-transistor 23B. The transistors 23A and 23B are connected in series as shown in FIG. 14. The series circuit of the transistor 23A and the transistor 23B is connected in series to a series circuit of the first DC power source 2A and the second DC power source 2B. The emitter terminal E is connected to the junction of the first DC power source 2A and the second DC power source 2B. Further, base terminals of the transistors 23A and 23B are connected to one terminal of a base resistor 13. The other terminal of the base resistor 13 is connected to a setter (not shown) which applies a positive voltage to the base resistor 13 in order to switch on the transistor 23A, or a negative voltage to the base of resistor 13 in order to switch on the transistor 23B.

In the embodiment of FIG. 14, if a positive current flows into the base resistor 13, the transistor 23A turns on and then the IGBT 1 turns on. On the other hand, if a negative current flows into the base resistor 13, the transistor 23B turns on and then the IGBT 1 turns off. Stray capacitance 14, a characteristics of the insulated gate semiconductor device such as the IGBT 1, exists between the terminals G and E of the IGBT 1.

According to the embodiment of FIG. 14, since the absolute value of voltage of the second DC power source 2B is higher than the absolute value of the voltage of the first DC power source 2A, the off gate current Ig for turning off the IGBT 1 can be larger than the on gate current Ig for turning on the IGBT 1. As a result, the gate control circuit 111 can have reduced delay time.

Figure 16:
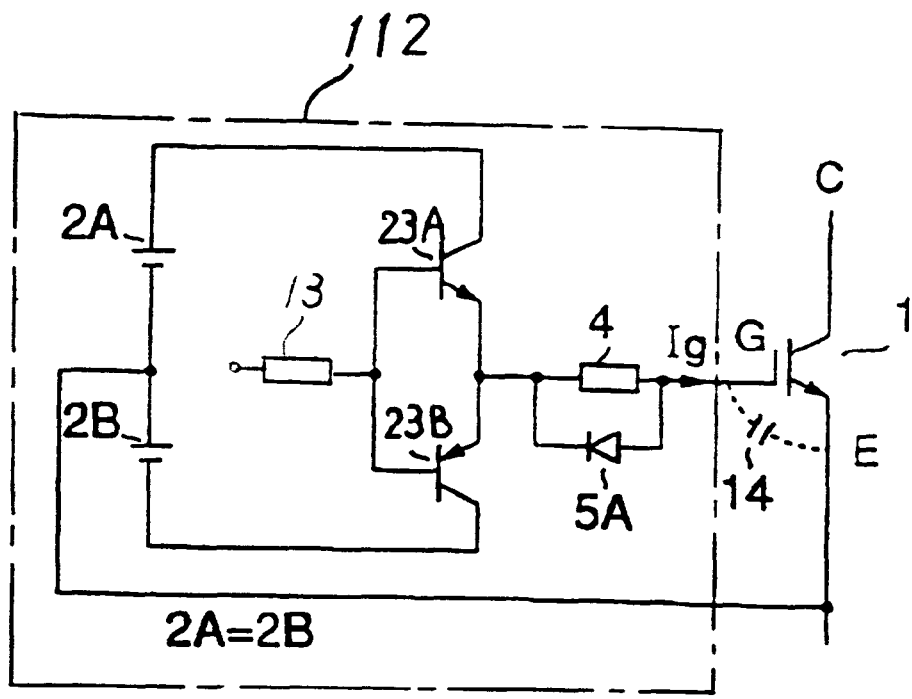
FIG. 16 is a circuit diagram of a gate control circuit of a twelfth embodiment of the present invention.

FIG. 16 shows a gate control circuit 112 of a twelfth embodiment of the present invention.

In the following description, only components different from the components explained in the eleventh embodiment shown in FIG. 14 are described.

In the twelfth embodiment, the absolute value of the voltage of the first DC power source 2A is the same as the absolute value of the voltage of the second DC power source 2B. Further, a diode 5A is connected in parallel to the gate resistor 4 so as to pass an off gate current Ig. As in FIG. 14, one terminal of the base resistor 13 is connected to the bases of the transistors 23A, 23B and the other terminal of the base resistor 13 is connected to a setter (not shown) which applies a positive voltage to the base resistor 13 in order to switch on the transistor 23A, or a negative voltage to the base of resistor 13 in order to switch on the transistor 23B.

Figure 17:
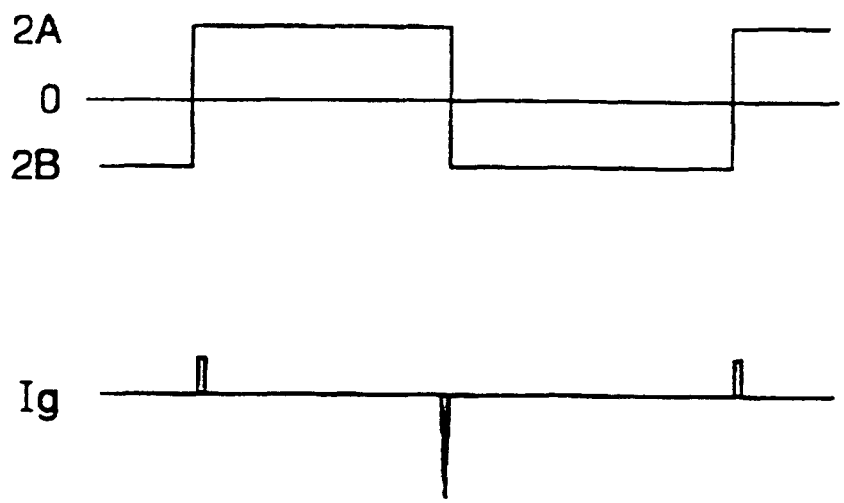
FIG. 17 is a timing chart showing a relationship between the voltages of DC power sources 2A and 2B, and a gate current Ig flowing in the IGBT of FIG. 16.

In the embodiment of FIG. 16, if the transistor 23A turns on, the on gate current Ig flows through a current path including the first DC power source 2A, the transistor 23A. the gate resistor 4 and stray capacitance 14, and the IGBT 1 turns on. On the other hand, if the transistor 23B turns on, the off gate current Ig flows through a current path including the second DC power source 2B, stray capacitance 14, the diode 5 and the transistor 23B, and the IGBT 1 turns off. That is, the current path for turning on the IGBT 1 includes the gate resistor 4, while the current path for turning off the IGBT 1 does not include the gate resistor 4. Consequently, even if the absolute values of the voltages of the first DC power source 2A and the second DC power source 2B are equal, the off gate current Ig is larger than the on gate current Ig as shown in FIG. 17. As a result, the gate control circuit 112 can have reduced delay time.

Figure 18:
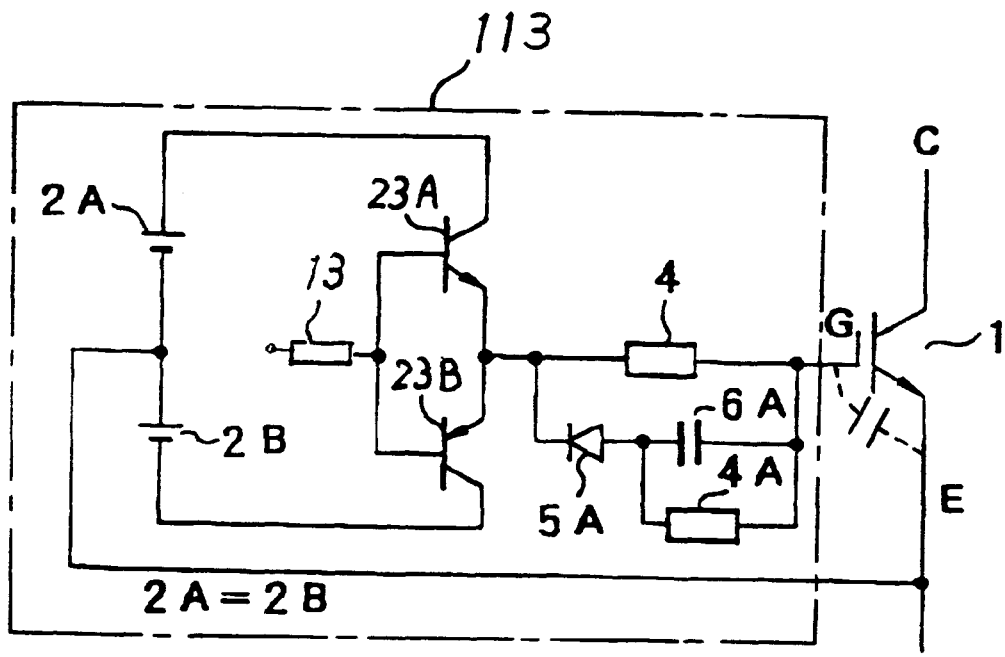
FIG. 18 is a circuit diagram of a gate control circuit of a thirteenth embodiment of the present invention.

FIG. 18 shows a gate control circuit 113 of a thirteenth embodiment of the present invention.

In the following description, only components different from the components explained in the twelfth embodiment in FIG. 16 are described.

In the thirteenth embodiment, a parallel circuit of a capacitor 6A and a resistor 4A is connected in series to the diode 5A. The capacitance of the capacitor 6A is larger than the capacitance of stray capacitance 14, and the resistance of the resistor 4A is higher than the resistance of the gate resistor 4.

In the thirteenth embodiment, if the transistor 23A turns on, the on gate current Ig flows a current path including the first DC power source 2A, the transistor 23A, the gate resistor 4 and stray capacitance 14, and the IGBT 1 turns on.

In this case, the on gate current Ig decreases due to the gate resistor 4. On the other hand, if the transistor 23B turns on, the off gate current Ig flows a current path including the second DC power source 2B, stray capacitance 14, the capacitor 6A, the resistor 4A, the diode 5 and the transistor 23B, and the IGBT 1 turns off. In this case, stray capacitance 14 discharges and the charge stored in the stray capacitance 14 is transferred to the capacitor 6A. The off gate current Ig hardly flows into the resistor 4A until the capacitor 6A is fully charged. Consequently, nearly all the off gate current Ig flows primarily into the capacitor 6A, and the off gate current Ig is larger than the on gate current Ig. Eventually, if the capacitor 6A is fully charged, the off gate current Ig flows into the resistor 4A and decreases compared to immediately after turning on the transistor 23B.

Further, even if the IGBT 1 fails and short-circuits, the transistor 23B is protected by the parallel circuit of the capacitor 6A and the resistor 4A.

Figure 19:
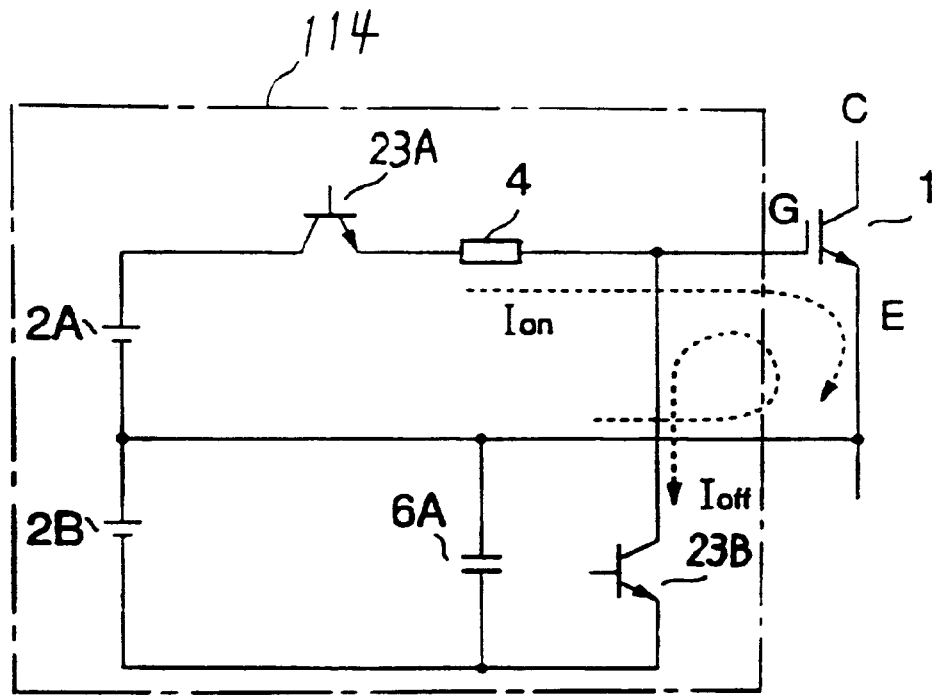
FIG. 19 is a circuit diagram of a gate control circuit of a fourteenth embodiment of the present invention.

FIG. 19 shows a gate control circuit 114 of a fourteenth embodiment of the present invention. In this embodiment, a series circuit of the gate resistor 4, the transistor 23A and the first DC power source 2A is connected between the terminals G and E of the IGBT 1. A series circuit of the second DC power source 2B and the capacitor 6A is connected in parallel thereto. The collector terminal of the transistor 23B is connected to the junction between the gate resistor 4 and the gate terminal G of the IGBT 1, and the emitter terminal of the transistor 23B is connected to the junction between the capacitor 6A and the negative terminal of the second DC power source 2B.

In the embodiment of FIG. 19, if the transistor 23A turns on, the on gate current Ig flows via the gate resistor 4. On the other hand, if the transistor 23B turns on, the off gate current Ig flows without via the gate resistor 4. As a result, the off gate current Ig of FIG. 19 flows fast compared to that of the gate control circuits shown in FIG. 16 and FIG. 18.

In the gate control circuit shown in FIG. 16, since the diode 5 exists in the circuit flowing the off gate current, a transient voltage sometimes arises at the moment the off gate current Ig rises from zero. The more the off gate current Ig suddenly rises, the more the transient voltage rises. If the transient voltage is produced, a subtraction voltage, i.e., the difference between the transient voltage and the voltage of the second DC power source, is applied to the IGBT 1. As a result, the off gate current Ig rises slowly, and the delay time is extended. Conversely, since the gate control circuit 114 in FIG. 19 does not have a diode in the off gate current path, the transient voltage does not exist. Accordingly, since the voltage applied to the IGBT 1 does not decrease, the off gate current Ig rises immediately.

Figure 20:
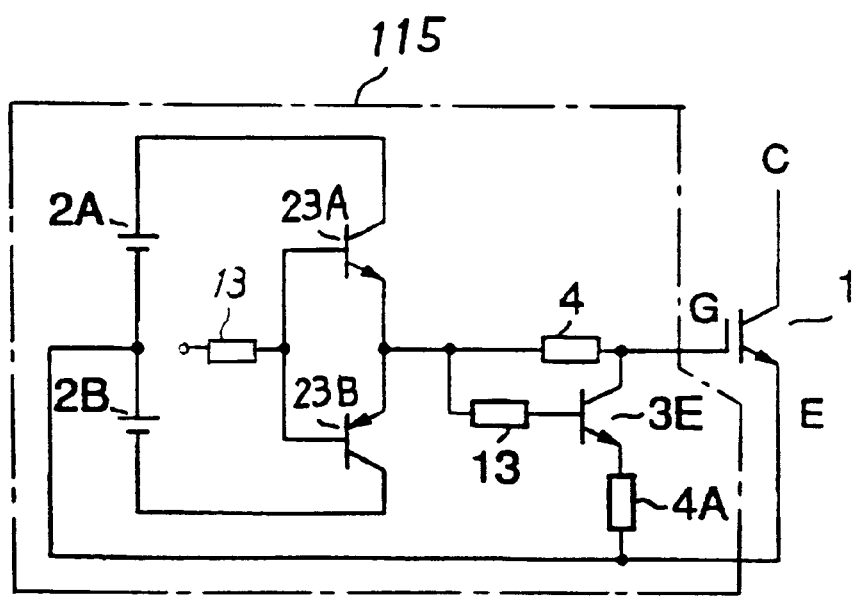
FIG. 20 is a circuit diagram of a gate control circuit of a fifteenth embodiment of the present invention.

FIG. 20 shows a gate control circuit 115 of a fifteenth embodiment of the present invention. In the following description, only components different from the components explained in the eleventh embodiment in FIG. 14 are described.

In the embodiment of FIG. 20, a transistor 3E, a resistor 4A and a resistor 13 are added to the gate control circuit 111 shown in FIG. 14. The resistor 13 and the base to collector of the transistor 3E are connected in parallel to the gate resistor 4. The emitter terminal of the transistor 3E is connected to the emitter terminal E of the IGBT 1 via the resistor 4A. When both the transistor 23A and 3E turn on, the IGBT 1 turns on. The voltage of the first DC power source 2A is then applied to the IGBT 1 and the on gate current Ig flows in the current path including the first DC power source 2A, the transistor 3C, the gate resistor 4, the resistor 13, the transistor 3E, the resistor 4A and the IGBT 1. On the other hand, when the transistor 23B turns on, the IGBT 1 turns off, and the voltage of the second DC power source 2B is then applied to the IGBT 1 and the off gate current Ig flows in the path including the IGBT 1, the gate resistor 4, the transistor 3D and the second DC power source 2B.

Eventually, even if the absolute value of the voltages of the first DC power source 2A and the second DC power source 2B are the same, the on gate current Ig becomes lower than the off gate current Ig because the voltage Vge is less than the first DC power source 2A while the on gate current Ig is flowing, and the voltage Vge is equivalent to the second DC power source 2B while the off gate current Ig is flowing.

When the IGBT 1 turns on, the voltage Vge is calculated as follows.

$$Vge = V_{2A} \times \{R_{4A}/(R_4 + R_{4A})\}$$

where:
Vge: the voltage between the gate terminal G and the emitter terminal E,
$V_{2A}$: the voltage of the first DC power source 2A,
$R_4$: the electric resistance of the gate resistor 4, and
$R_{4A}$: the electric resistance of the gate resistor 4A.

Figure 21:
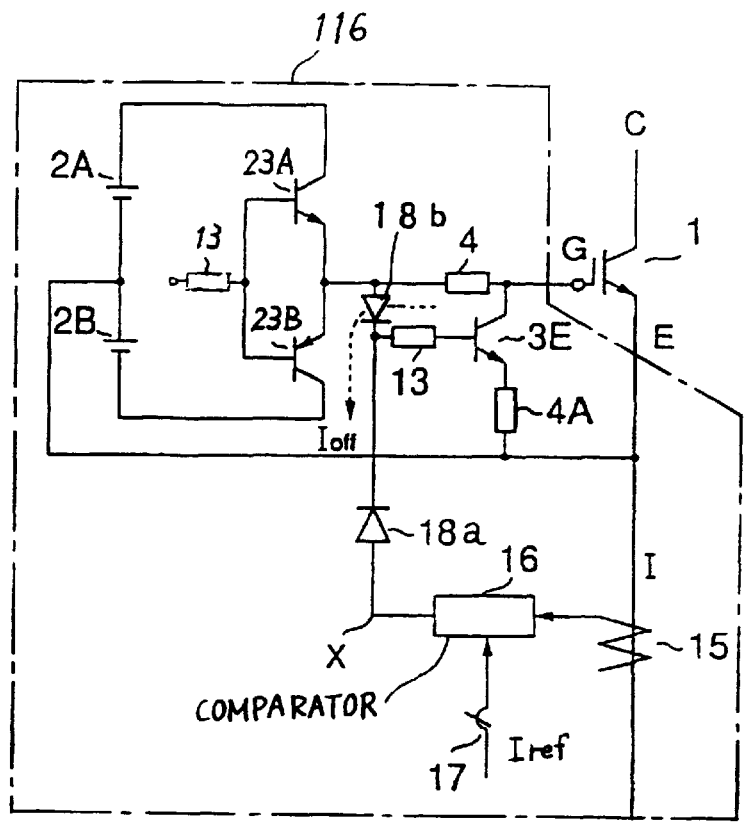
FIG. 21 is a circuit diagram of a gate control circuit of a sixteenth embodiment of the present invention.

FIG. 21 shows a gate control circuit 116 of a sixteenth embodiment of the present invention. In the following description, only components different from the components explained in the fifteenth embodiment shown in FIG. 20 are described.

When an overcurrent occurs, a surge overvoltage may be caused. Therefore, in this embodiment, as shown in FIG. 21, a current sensor 15, a current comparator 16, diodes 18a and 18b, and a setter 17 are added to the gate control circuit 115 in FIG. 20. In FIG. 21, the current sensor 15 detects an emitter current flowing in the IGBT 1 and outputs the detected current value to the current comparator 16. The current comparator 16 compares the current value with a reference current Iref from the setter 17. If the detected emitter current value exceeds the reference current Iref, the comparator 16 outputs a signal X to the base terminal of the transistor 3E via the diode 18a and the resistor 13 in order to turn on the transistor 3E. The diode 18b prevents the signal X from flowing to the IGBT 1 as a on gate current Ig.

Figure 22:
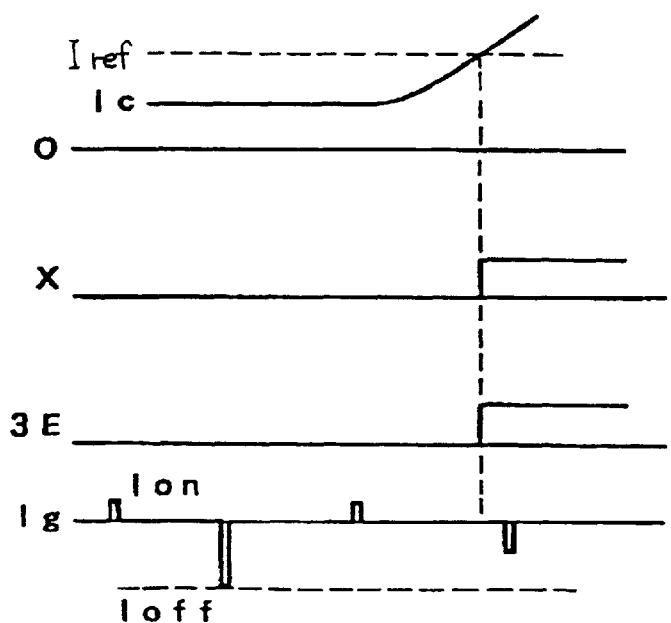
FIG. 22 is a timing chart showing a relationship between a current Ic and an on-off timing of a transistor 3E in FIG. 21.

As shown in FIG. 22, if the detected current value flowing in the IGBT 1 exceeds the reference current Iref, the transistor 3E turns on. When the transistor 3E turns on, a relatively low off gate current Ig flows in the IGBT 1. Accordingly, an outbreak of the surge overvoltage can be stopped. The operation and effect are otherwise the same as the gate control circuit 115 of the fifteenth embodiment shown in FIG. 20.

Figure 23:
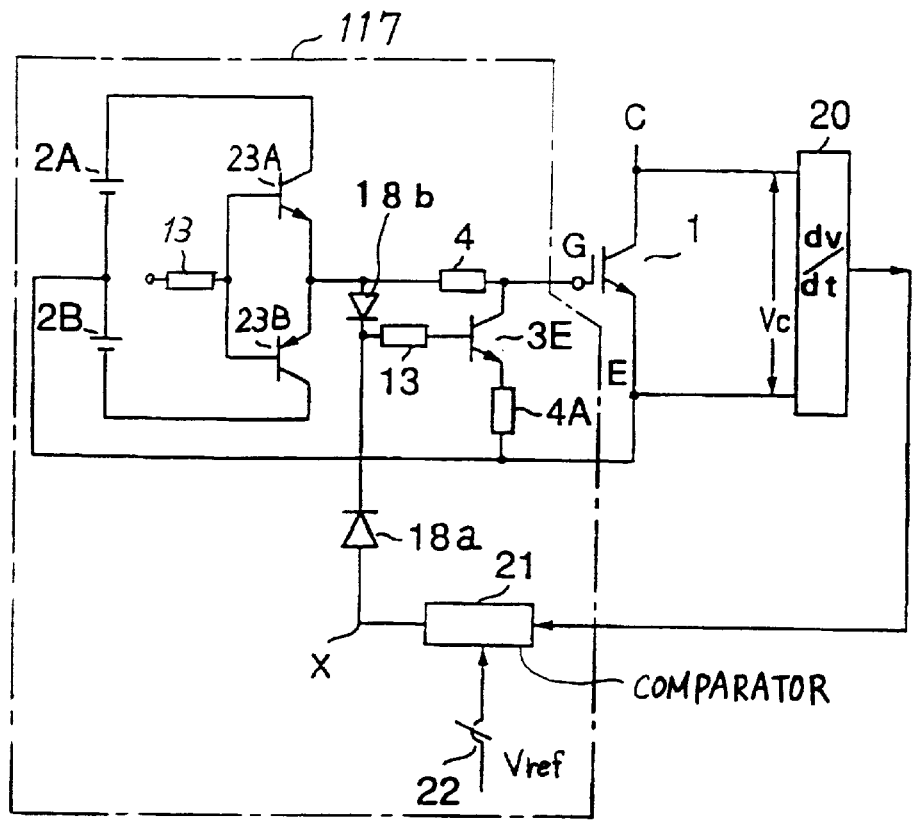
FIG. 23 is a circuit diagram of a gate control circuit of a seventeenth embodiment of the present invention.

FIG. 23 shows a gate control circuit 117 of a seventeenth embodiment of the present invention. In the following description, only components different from the components explained in the fifteenth embodiment in FIG. 20 are described.

When a change rate of the voltage applying to the IGBT 1 exceeds a certain value, a surge overvoltage may be caused. Therefore, in this embodiment, as shown in FIG. 23, a voltage rate change detector 20, a comparator 21, diodes 18a and 18b, and a setter 22 are added to the gate control circuit 115 in FIG. 20.

In this embodiment, the voltage rate change detector 20 detects the rate of change of the collector-emitter voltage Vce of the IGBT 1 and outputs the detected value to the comparator 21. The comparator 21 compares the detected value with a reference threshold Vref from the setter 22. If the voltage variation value exceeds the reference threshold Vref, the comparator 21 outputs a signal X to the base terminal of the transistor 3E via the diode 18a and the resistor 13 in order to turn on the transistor 3E. The diode 18b prevents the signal X from flowing to the IGBT 1 as a on gate current Ig.

Figure 24:
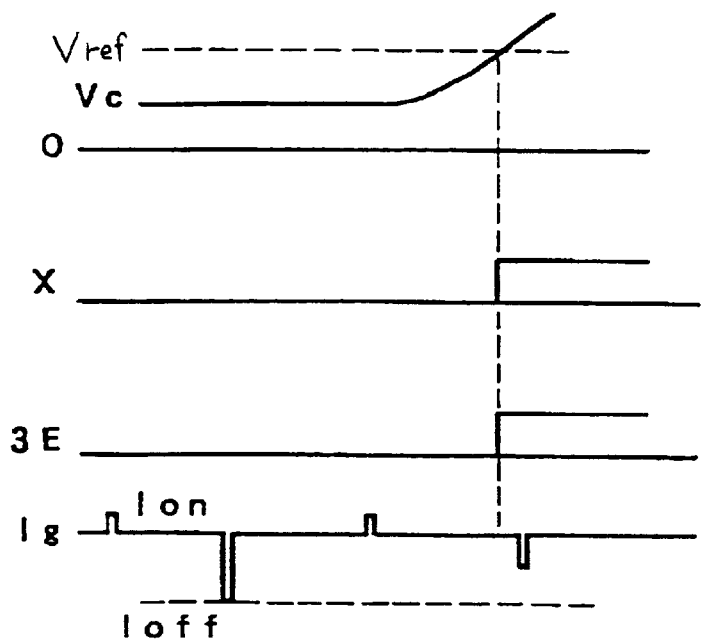
FIG. 24 is a timing chart showing a relationship between a voltage Vce and an on-off timing of a transistor 3E in FIG. 23.

As shown in FIG. 24, if the detected rate change value exceeds the reference voltage threshold Vref, the transistor 3E turns on. When the transistor 3E turns on, a relatively low off gate current Ig flows in the IGBT 1. Accordingly, an outbreak of the surge overvoltage can be stopped.

Figure 25:
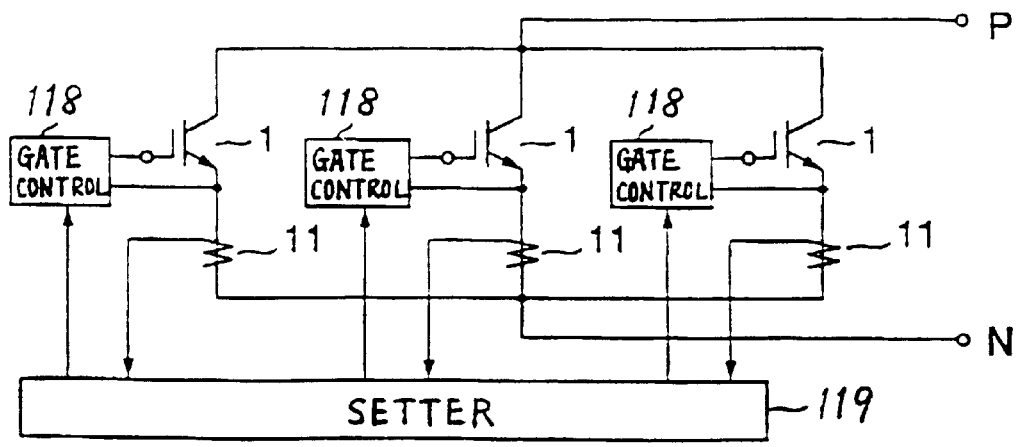
FIG. 25 is a circuit diagram of a power converter circuit of a first embodiment of the present invention.

FIG. 25 shows a power converter circuit of the first embodiment of the present invention. In this power converter circuit, three insulated gate semiconductor devices such as IGBT 1 are respectively connected in parallel and each of the IGBTs 1 has a collector terminal, an emitter terminal and a gate terminal. The IGBTs 1 are connected between the positive terminal P and the negative terminal N.

In FIG. 25, current sensors 11 respectively detect currents flowing in the IGBTs 1. Three gate control circuits 118 apply gate signals to gate terminals of respective IGBTs 1. One of the above described gate control circuits 101 through 110 is used as the gate control circuits 118. Setter 119 receives the current values from the current sensors 11 and outputs control signals to the gate control circuits 118 on the basis of the current value. That is, setter 119 sets the time duration that the switch 3C is on in order to control the amount of charge stored in the capacitor 6. The setter 119 detects a timing of turning off the IGBTs 1, that is, the setter 119 detects the timing that currents Ic flowing in the IGBTs 1 start to drop. Then, if setter 119 detects one IGBT 1 with late timing, the setter 119 sets an amount sufficient to increase a charge stored in capacitor 6 of the gate control circuit 118 corresponding to the IGBT 1 with the late timing. On the other hand, if the setter 119 detects one IGBT 1 with the fast timing, the setter 119 sets a decrease in the amount of charge stored in the capacitor 6 of the gate control circuit 118 corresponding to the IGBT 1 with the fast timing. Therefore, since the delay time of the IGBT 1 with the late timing is shortened, all IGBTs 1 can be turned off simultaneously. As a result, the gate current Ig does not concentrate on one of the IGBTs 1.

Figure 26:
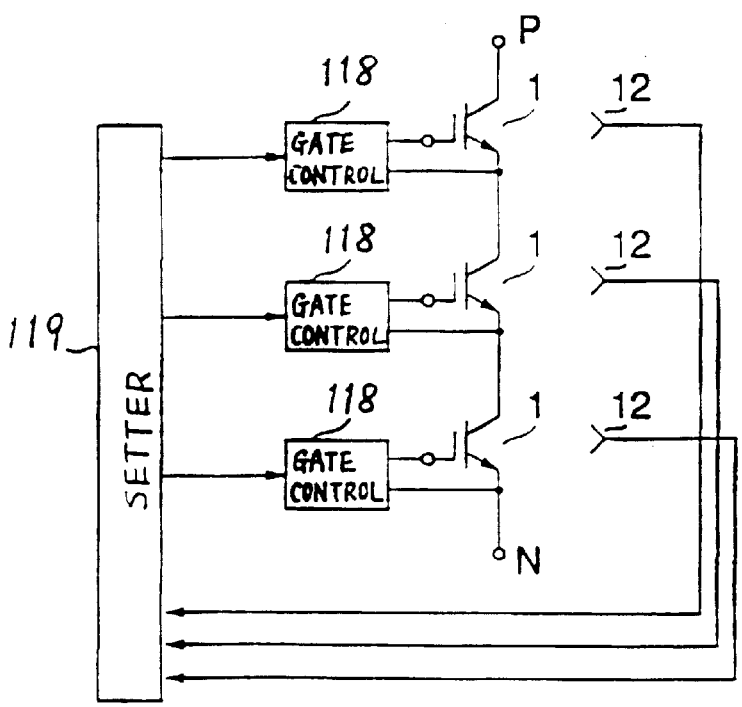
FIG. 26 is a circuit diagram of a power converter circuit of a second embodiment of the present invention.

FIG. 26 shows a power converter circuit of the second embodiment of the present invention, in which three insulated gate semiconductor devices such as IGBT 1 are respectively connected in series and each of the IGBTs 1 has a collector terminal, an emitter terminal and a gate terminal. The serial circuit of the IGBTs 1 is connected between the positive terminal P and the negative terminal N.

In FIG. 26, voltage sensors 12 detect respective voltages Vce produced across the collectors and emitters of respective of the IGBTs 1. Three gate control circuits 118 apply the gate signals to gate terminals of respective IGBTs 1. One of the gate control circuits 101 through 110, as above described, is used as the gate control circuits 118. Setter 119 receives as inputs the voltage values from the voltage sensors 12 and outputs control signals to the gate control circuits 118 on the basis of the voltage value. The setter 119 responds to the turning off the IGBTs 1 by detecting the timing that voltages Vce of the IGBTs 1 start to rise and then sets the time duration that the switch 3C is on in order to control the amount of charge stored in the capacitor 6. Then, if one of the setters 119 detects one IGBT 1 with late timing, the setter 119 increases the on time of the switch 3C to increase the charge stored in the capacitor 6 of the gate control circuit 118 corresponding to the IGBT 1 with the late timing. On the other hand, if one of the setters 119 detects an IGBT 1 with fast timing, the setters 119 decreases the on time of the switch 3C to decrease the charge stored on the capacitor 6 of the gate control circuit 118 corresponding to the IGBT 1 with fast timing. Therefore, since the delay time of the IGBT 1 with the late timing is shortened, all IGBTs 1 can be turned off simultaneously. As a result, the voltage Vge does not concentrate on one of the IGBTs 1.

Numerous modifications and variations of the present invention should be apparent to those of ordinary skill in the art in light of the above teachings. For example, semiconductor switches such as transistors the switches can be used for the 3A, 3B and 3C in the gate control circuit 101 through 110. Further, other semiconductor devices or mechanical switches can be substituted for the transistors 23A and 23B in the gate control circuit 111 through 117. Anti-paralleled semiconductor switches, semiconductor switches which can flow a current in both directions or other switches which can flow a current in both directions can be substituted for the transistor 3E in the gate control circuit 115 through 117. It is therefore to be understood that within the scope of the appended claims, the invention may be practiced otherwise than as specifically described herein.

What is claimed as new and desired to be secured by Letters Patent of the United States is:

1. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch; and a turn off assist circuit configured to produce a negative charge on said capacitor to assist in turning off said insulated gate semiconductor devices;

wherein said turn off assist circuit comprises a third DC power source coupled in series with a third switch.

2. A gate control circuit for turning on and off an insulated gate semiconductor device having a collector terminal, an emitter terminal and a gate terminal, comprising:

a first DC power source coupled to the gate terminal of the respective insulated gate semiconductor device via a first switch and configured to apply a positive voltage to said gate terminal in order to turn on said insulated gate semiconductor device when said first switch is turned on and said second switch is turned off; and a second DC power source coupled to said gate terminal of the respective insulated gate semiconductor device via a second switch and configured to apply a negative voltage to said gate terminal in order to turn off said insulated gate semiconductor device when said second switch is turned on and said first switch is turned off;

wherein an off gate current applied by said second DC power source is greater than an on gate current applied by said first DC power source;

a gate resistor coupled between said gate terminal and said first DC power source such that said first DC power source applies said positive voltage to said gate terminal via said gate resistor in order to turn on said insulated gate semiconductor device; and a series circuit coupled in parallel with said gate resistor, said series circuit comprising a diode coupled in series with a parallel circuit of a capacitor and a resistor.

3. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch; and a turn off assist circuit configured to produce a negative charge on said capacitor to assist in turning off said insulated gate semiconductor device;

wherein said turn off assist circuit comprises:

a third switch coupled between a junction between said first and second DC power sources and a terminal of said capacitor; and a fourth switch coupled between said diode and said junction between said terminal of said capacitor and said third switch.

4. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch; and a turn off assist circuit configured to produce a negative charge on said capacitor to assist in turning off said insulated gate semiconductor device;

wherein said turn off assist circuit charges said capacitor less than an amount which can turn off said insulated gate semiconductor device.

5. The gate circuit as recited in claim 1, wherein said third DC power source comprises a variable DC voltage power source.

6. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch;

a turn off assist circuit configured to produce a negative charge on said capacitor to assist in turning off said insulated gate semiconductor device; and a resistor coupled to series with said third DC power source to control the charging time of said capacitor.

7. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch; and a turn off assist circuit configured to produce a negative charge on said capacitor to assist in turning off said insulated gate semiconductor device;

wherein said turn off assist circuit comprises:

a coil coupled in series with a third switch across said first DC power source and having a terminal coupled to said capacitor, said coil configured to be given energy by said first DC power source via said third switch during turn on of said insulated gate semiconductor device and to charge said capacitor to assist in turning off said insulated gate semiconductor device during turn off of said insulated gate semiconductor device.

8. A gate control circuit for turning on and off an insulated gate semiconductor device having a collector terminal, an emitter terminal and a gate terminal, comprising:

a first DC power source coupled to said gate terminal via a first switch and configured to apply a positive voltage to said gate terminal in order to turn on said insulated gate semiconductor device when said first switch is turned on and a second switch is turned off;

a second DC power source coupled to said gate terminal via said second switch and configured to apply a negative voltage to said gate terminal in order to turn off said insulated gate semiconductor device when said second switch is turned on and said first switch is turned off;

a parallel circuit of a diode and a capacitor coupled in series to said second switch; and a turn off assist circuit configured to produce a negative charge on said capacitor to assist in turning off said insulated gate semiconductor device;

wherein said turn off assist circuit comprises:

a coil coupled in series with a third switch across said second DC power source and having a terminal coupled to said capacitor, said coil configured to be given energy by said second DC power source via said third switch during turn on of said insulated gate semiconductor device and to charge said capacitor to assist in turning off said insulated gate semiconductor device during turn off of said insulated gate semiconductor device.

9. A power converter circuit having a plurality of insulated gate semiconductor devices, each insulated gate semiconductor device having a collector terminal, an emitter terminal and a gate terminal, comprising:

a plurality of current sensors configured to detect currents flowing in respective of said insulated gate semiconductor devices;

a plurality of gate control circuits configured to turn on and off respective of said insulated gate semiconductor devices, each of said gate control circuits comprising, a first DC power source coupled to the gate terminal of the respective insulated gate semiconductor device via a first switch and configured to apply a positive voltage to said gate terminal in order to turn on said insulated gate semiconductor device when said first switch is turned on and said second switch is turned off, a second DC power source coupled to said gate terminal of the respective insulated gate semiconductor device via a second switch and configured to apply a negative voltage to said gate terminal in order to turn off said insulated gate semiconductor device when said second switch is turned on and said first switch is turned off, and a parallel circuit of a diode and a capacitor coupled in series to said second switch; and a setter configured to receive outputs of said sensors and based on the currents detected by said sensors to determine turn-off times of said insulated gate semiconductor devices, said setter controlling an amount of charge stored in each of said capacitors such that, when one of said turn-off times of one of said insulated gate semiconductor devices is late, said setter increases the amount of charge stored in the capacitor corresponding to said one of said insulated gate semiconductor devices.

10. A power converter circuit having a plurality of insulated gate semiconductor devices, each said insulated gate semiconductor device having a collector terminal, an emitter terminal and a gate terminal, comprising:

a plurality of voltage sensors configured to detect collector-emitter voltages across said insulated gate semiconductor devices;

a plurality of gate control circuits for turning on and off respective of said insulated gate semiconductor devices, each of said gate control circuits comprising, a first DC power source coupled to the gate terminal of the respective insulated gate semiconductor device via a first switch and configured to apply a positive voltage to said gate terminal in order to turn on said insulated gate semiconductor device when said first switch is turned on and said second switch is turned off, a second DC power source coupled to said gate terminal of the respective insulated gate semiconductor device via a second switch and configured to apply a negative voltage to said gate terminal in order to turn off said insulated gate semiconductor device when said second switch is turned on and said first switch is turned off, and a parallel circuit of a diode and a capacitor coupled in series to said second switch; and a setter configured to receive outputs of said sensors and based on the voltages detected by said sensors to determine turn-off times of said insulated gate semiconductor devices, said setter controlling an amount of charge stored in each of said capacitors such that, when one of said turn-off times of one of said insulated gate semiconductor devices is late, said setter increases the amount of charge stored in the capacitor corresponding to said one of said insulated gate semiconductor devices.

11. A gate control circuit for turning on and off an insulated gate semiconductor device having a collector terminal, an emitter terminal and a gate terminal, comprising:

a first DC power source coupled to the gate terminal of the respective insulated gate semiconductor device via a first switch and configured to apply a positive voltage to said gate terminal in order to turn on said insulated gate semiconductor device when said first switch is turned on and said second switch is turned off;

a second DC power source coupled to said gate terminal of the respective insulated gate semiconductor device via a second switch and configured to apply a negative voltage to said gate terminal in order to turn off said insulated gate semiconductor device when said second switch is turned on and said first switch is turned off;

a series circuit of a resistor and a third switch coupled between said gate terminal and said emitter terminal, wherein said third switch is turned on at the time said insulated gate semiconductor device is turned on, and said third switch is turned off at the time said insulated gate semiconductor device is turned off.

12. The gate control circuit as recited in claim 11, further comprising:

a current detector coupled to said third switch and configured to detect a current flowing in said insulated gate semiconductor device, said third switch configured to switch on at a time when said current detector detects that said current flowing in said insulated gate semiconductor device exceeds a predetermined current value.

13. The gate control circuit as recited in claim 11, further comprising:

a voltage rate change detector configured to detect a rate of change of a voltage across the collector and emitter terminals of said insulated gate semiconductor device, said third switch configured to switch on when said voltage rate change detector detects that said rate of change exceeds a predetermined rate of change of said voltage.

* * * * *